United States Patent [19]

Miller

[11] Patent Number: 4,998,063
[45] Date of Patent: Mar. 5, 1991

[54] FIBER OPTIC COUPLED MAGNETO-OPTIC SENSOR HAVING A CONCAVE REFLECTIVE FOCUSING SURFACE

[75] Inventor: Robert C. Miller, Salem Township, Westmoreland County, Pa.

[73] Assignee: ABB Power T & D Company, Inc., Blue Bell, Pa.

[21] Appl. No.: 387,570

[22] Filed: Jul. 31, 1989

[51] Int. Cl.[5] .................. G01R 33/032; G01R 15/07; G02F 1/09
[52] U.S. Cl. ..................... 324/244; 324/96; 350/378
[58] Field of Search ........................ 324/96, 244, 260; 350/375, 376, 378; 356/368

[56] References Cited

U.S. PATENT DOCUMENTS

| 3,707,321 | 12/1972 | Jaecklin et al. | 350/378 X |
| 4,560,932 | 12/1985 | Mitsui et al. | 324/96 X |
| 4,608,535 | 8/1986 | Tada et al. | 324/96 X |
| 4,612,500 | 9/1986 | Chen et al. | 324/96 |
| 4,613,811 | 9/1986 | Vaerewyck et al. | 324/96 |

FOREIGN PATENT DOCUMENTS

| 2017863 | 11/1970 | Fed. Rep. of Germany | 324/96 |
| 0120970 | 7/1984 | Japan | 324/260 |
| 0129676 | 7/1985 | Japan | 324/244 |
| 0212773 | 9/1986 | Japan | 324/96 |

Primary Examiner—Gerard R. Strecker
Attorney, Agent, or Firm—A. J. Rossi

[57] ABSTRACT

A device for monitoring a magnetic field intensity having a given direction, the device including: a light conducting member (11) defining a first optical port (23), a second optical port (24), an optical path extending between the ports, and elements (31,34) for causing light to travel along the path between the ports (23,24); a first polarizer (31) disposed in the optical path for polarizing the light beam in a first plane of polarizaiton transverse to the path; a second polarizer (33) disposed in the optical path for polarizing the light beam in a second plane of polarization transverse to the path, the second polarizer (33) being spaced along the path from the first polarizer (31); and a focusing surface (18) disposed to intersect the beam at a point along the path between the polarizers (31,33) to focus the light beam from the first optical port (23) onto the second optical port (24). The light conducting member (11) constitutes a medium between the first and second polarizers (31,33) for permitting rotation of the plane of polarization of the light beam under influence of the magnetic field when the device is oriented so that at least a portion of the optical path between the polarizers (31,33) extends in a direction having a component parallel to the given direction so that the intensity of the light beam at the second optical port (24) will vary as a function of variations in the intensity of the magnetic field.

10 Claims, 2 Drawing Sheets

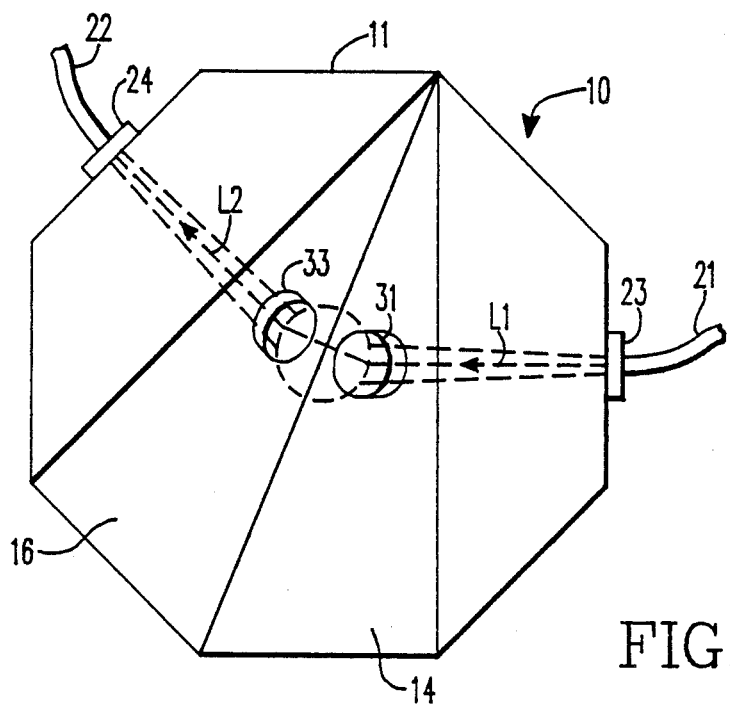
FIG.1
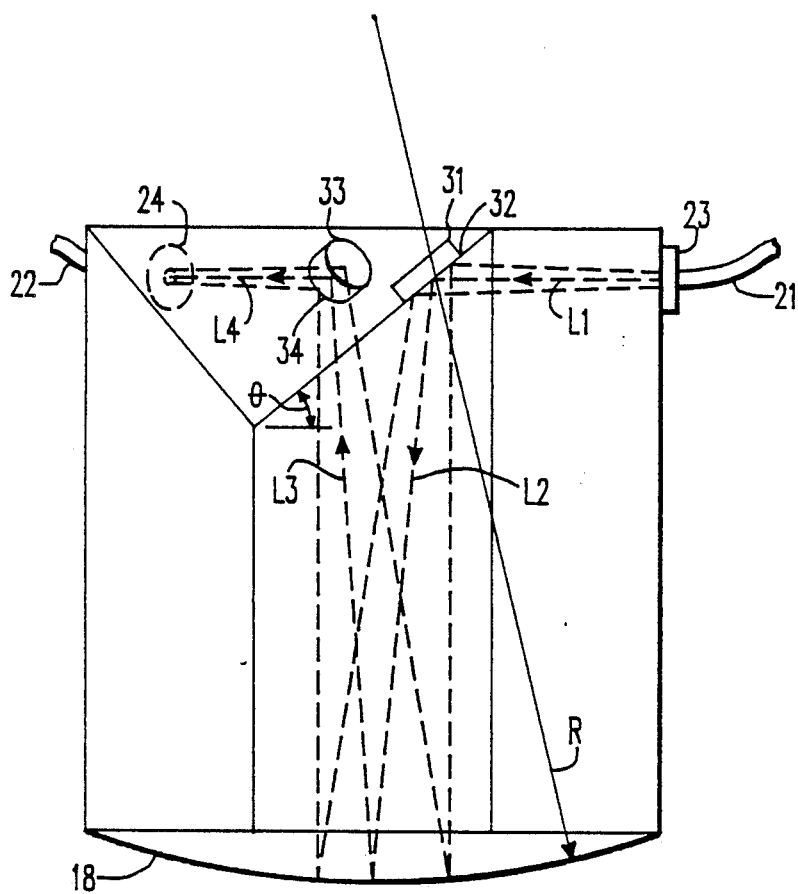

FIBER OPTIC COUPLED MAGNETO-OPTIC SENSOR HAVING A CONCAVE REFLECTIVE FOCUSING SURFACE

BACKGROUND OF THE INVENTION

The present invention relates to a magneto-optic sensor for use in electrical measuring systems. More particularly, the invention relates to a Faraday effect sensor where electrical field intensity is measured by the rotation of a polarized light beam passing through a transparent magnetically active medium. The present invention is well suited for coupling to a fiber optic light cable.

Present sensors of this type typically employ a pair of collimators and a pair of polarizers which define a light conduction path through the transparent magnetically active material. A magnetic field to be measured is produced near the sensor. Often the field is produced by a current to be measured flowing through a conductor. Light radiation traversing this path experiences an intensity variation which is proportional to the instantaneous amplitude (positive or negative) of the current. Therefore, by comparing the intensities of the light radiation at the input and output of the light conduction path, it is possible to obtain a current measurement.

Typically the light radiation is generated by a light emitting element and received by a photo detector, each of which is coupled to one end of the light conducting path of the sensor by a respective fiber optic cable. The light emitting element and the photo detector are electrically connected to form part of a suitable processing circuit.

While such a system is generally capable of providing a good current measurement, it is frequently desired to employ a more compact sensor for use with a high permeability core as a passive current sensor. In such a situation, the size of the sensor is of great importance.

SUMMARY OF THE INVENTION

It is an object of the invention to provide a magneto-optic sensor which is compact and inexpensive to manufacture.

It is another object, advantage and feature of the invention to provide a magneto-optic sensor which eliminates the need for a pair of collimators.

It is yet another object, advantage and feature of the present invention to provide a magneto-optic sensor which is particularly adapted for use with a magnetic core to serve as a passive current sensor.

It is yet another object, advantage and feature of the invention to provide a new and improved means for polarizing the light beam in a magneto-optic sensor.

The above and other objects of the invention are achieved, according to the present invention, by a device for monitoring a magnetic field intensity having a given direction comprising: light conducting means defining a first optical port, a second optical port, an optical path extending between the ports, and means for causing light to travel along the path between the ports; a first polarizer disposed in the optical path for polarizing the light beam in a first plane of polarization transverse to the path; a second polarizer disposed in the optical path for polarizing the light beam in a second plane of polarization transverse to the path, the second polarizer being spaced along the path from the first polarizer; and means defining a focusing surface disposed to intersect the beam at a point along the path between the polarizers to focus the light beam from the first optical port onto the second optical port, wherein the light conducting means constitute a medium between the first and second polarizers for permitting rotation of the plane of polarization of the light beam under influence of the magnetic field when the device is oriented so that at least a portion of the optical path between the polarizers extends in a direction having a component parallel to the given direction so that the intensity of the light beam at the second optical port will vary as a function of variations in the intensity of the magnetic field.

As used herein, the term "light" refers to electromagnetic radiation in the wavelength range capable of being propagated in an optical fiber, and particularly radiation in the visible and infrared region.

BRIEF DESCRIPTION OF THE DRAWINGS

FIG. 1 is a top view of a magneto-optic sensor according to a preferred embodiment of the invention.

FIG. 2 is a side view of the magneto-optic sensor shown in FIG. 1.

FIG. 2A is a detail side view showing a fiber optic cable coupled to the sensor of FIG. 2.

DESCRIPTION OF THE PREFERRED EMBODIMENT

Figure 3:
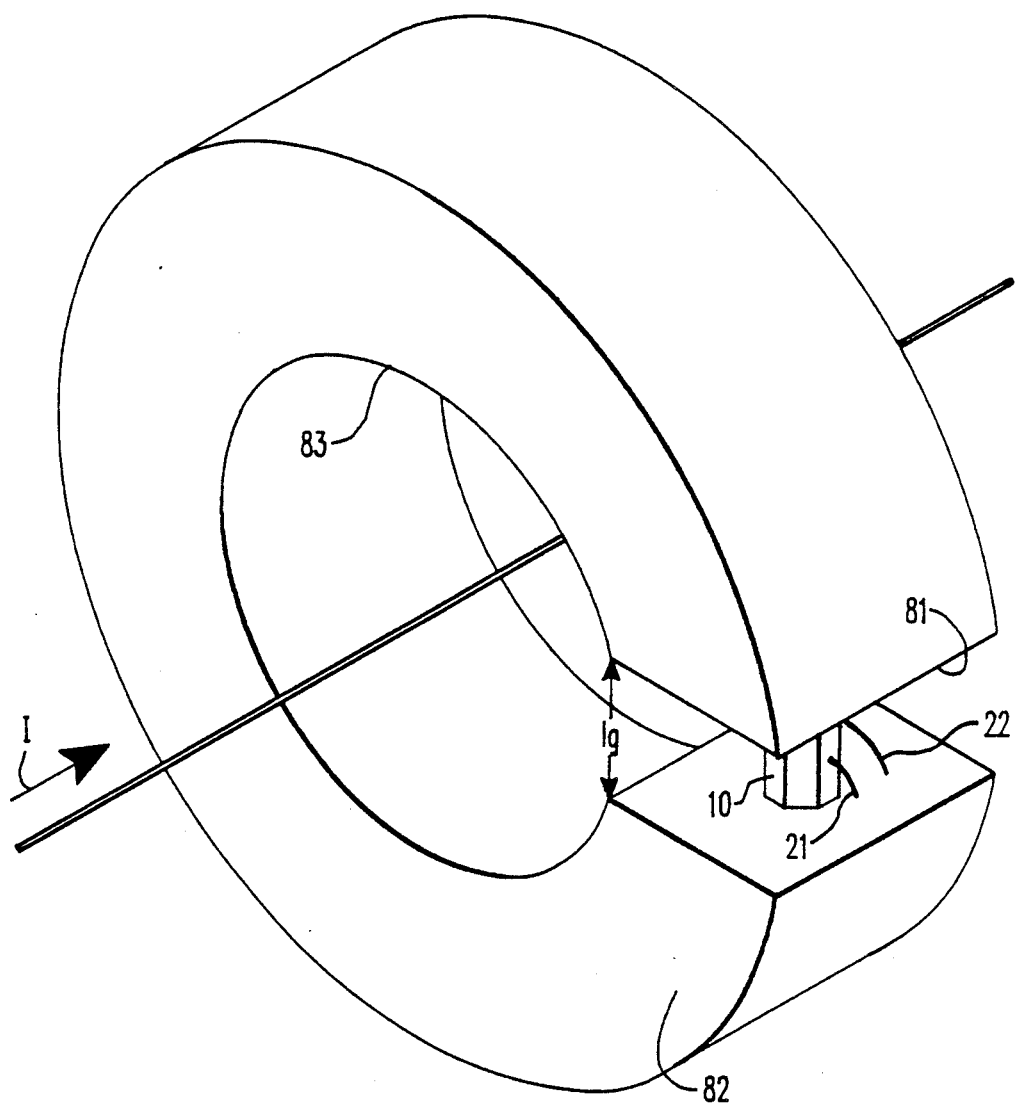
FIG. 3 is a perspective view of the magneto-optic sensor of FIGS. 1 and 2, in use with a high permeability core, to form a passive current sensor.

The invention will now be described according to the preferred embodiment as shown in the Figures. Reference will be made to the accompanying drawings in which like numerals refer to like elements throughout.

A magneto-optic sensor 10 according to the present invention is shown in FIGS. 1 and 2. The main body 11 is seen to be in the shape of a prism having a regular octagonal cross section. The upper end of the body 11 includes two angled faces 14 and 16 as shown. The regular octagonal cross section of body 11 is shown to allow for simple identification of the angles of the angled faces 14 and 16 and to establish an angle of 45° between the planes of polarization of the entrance and exit polarizers. However, body 11 may have any suitable cross section. The cross section of body 11 also may vary along its length, rather than being constant. Generally, faces 14 and 16 are each oriented at an angle $\Theta$ approximately equal to 45° from horizontal but the angle may vary depending on the type of polarizing disks used. The lower end of the body 11 has a reflective curved surface 18 as shown. The curved surface 18 is shown having a spherical shape. However, the surface 18 may be of any other suitable concave curved shape, such as an ellipsoid, which will refocus the light beam as it is reflected upwards. The surface 18 should be made reflective by the application of a suitable reflective material such as a silver coating.

Fiber optic cables 21, 22 are attached to the body 11 by means of attachment buttons 23 and 24 as shown. The attachment buttons 23 and 24 hold the ends of the fiber optic cables 21, 22 in optical contact with body 11 and constitute inlet and outlet ports for a light beam. A light beam input is provided by input light cable 21. As shown in FIG. 2a, the light beam enters the body 11 at the point of attachment where the beam will diverge with a half angle $\phi$ which is given by $\sin(\phi) = NA/n$, where NA is the numerical aperture of the fiber 21 and n is the refractive index of the material of the body 11. Path L1 shows the center line of the path of the beam which is diverging. The diverging light beam follows the path L1 until it reaches angled face 14. A polarizing disk 31 is attached to face 14. Polarizing disk 31 has a multilayer coating 32 on the surface which is in contact with body face 14, to reflect and polarize the light beam. Polarizing disk 33 has a similar coating 34. These coatings may be of the type used in beam splitting polarizers.

The polarized beam is now directed downward through body 11 along the path shown by L2. L2 shows the center line of the path of the diverging polarized beam. The diverging polarized beam L2 contacts the reflective spherical surface 18, from which it is reflected upwards along path L3. The spherical shape of the surface 18 acts to refocus the beam so that it converges and will be refocused when it reaches the output fiber optic cable 22. The converging beam L2 reaches angle surface 16 where it is polarized again and reflected by a second polarizing disk 33. Disk 33 is similar to disk 31 and includes multilayer coating 34. Next, the beam travels along path L4 to the output fiber optic cable 22. At this point, the light beam has converged and has been refocused by the spherical surface 18.

In order to assure proper focusing, radius of curvature R of the spherical surface 18 should be equal to the optical paths L1+L2 and equal to the optical paths L3+L4. The center of curvature of spherical surface 18 will usually be located so that a vertical line therethrough is equidistant from disks 31 and 33. Also, since the beam is diverging with half angle $\phi$ along paths L1 and L2, the outer dimensions of body 11 must be large enough so that the diverging beam does not intersect any faces other than 14 and 16 before reaching spherical surface 18.

The body 11 can be formed of any material which is transparent at the operating wavelength, as long as the polarizing disks 31 and 33 can be attached thereto. Fused silica and BK7 glass are good materials because compatible polarizing coatings are available. Materials such as SF6 and SF57 glass are preferable in some cases because of their higher Verdet coefficients which result in greater sensitivity to magnetic fields. The body 11 can be fabricated from a single piece or several pieces of the chosen optical material. If several pieces are used, the pieces are bonded together with optical cement to form the body.

Often, because of manufacturing tolerances, it is not practical to predict the exact locations of the buttons 23 and 24. These locations are then best determined by trial and error. One of the fibers is connected to a light source and the other fiber to a detector. The positions of the buttons can then be adjusted until the locations at which there is a minimum attenuation is found. The buttons may then be fastened in these positions with optical cement.

The operation and function of the present invention will now be described. FIG. 3 shows the sensor 10 installed in the gap 81 of a high permeability magnetic core 82. This arrangement is recommended if the sensor is to be used to measure alternating electrical currents. The conductor in which the current is to be measured is passed through the gap 81 of the core 82 and the sensor 10 is placed in a hole 83 in the core 82.

Light energy is then supplied to the sensor by input fiber optic cable 21. The light wavelength should be equal to the wavelength for which the polarizing coatings 32 and 34 are effective. After the light is polarized by polarizing disk 31, the light travels along paths L2 and L3 which are roughly parallel to one another. As the linearly polarized light beam travels along L2 and L3, it is rotated by the magnetic flux. This phenomenon is well known as Faraday rotation. In general, the angle of rotation is equal to the field strength multiplied by the interaction length, multiplied by a constant (the Verdet constant).

The rotation of the polarized light beam will change the intensity of the light beam on path L4 depending on the polarizing angles of disks 31 and 33. Thus, the intensity of the light reaching output fiber 22 will be reduced or increased compared to the intensity of the light from input fiber 21, depending on the magnetic flux present and the relative polarizing angles used.

If alternating electrical current is to be measured, the ratio of the AC to DC components of the output of the sensor, when connected to a light source having a wavelength equal to that for which the polarizing coatings were designed, is given approximately by AC/DC=4·V·I·l/lg where V is the Verdet coefficient in radians per ampturn, I is the amplitude of the current flowing in the conductor, 1 is the vertical length of the optical path (L2+L3), and lg is the length of the gap 81 in the core. Circuits such as those used with magneto-optic current transducers can be used to calculate the ratio of the AC to DC terms and determine the current flowing in the conductor.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A device for monitoring a magnetic field intensity having a given direction comprising:

light conducting means defining a first optical port, a second optical port, and an optical path extending between said ports for conducting a light beam between said ports;

a first polarizer disposed in said optical path for polarizing the light beam in a first plane of polarization transverse to said path;

a second polarizer disposed in said optical path for polarizing the light beam in a second plane of polarization transverse to said path, said second polarizer being spaced along said path from said first polarizer; and means defining a concave reflective focusing surface disposed to intersect the light beam at a point along said path between said polarizers to focus the light beam from said first optical port onto said second optical port, wherein said means defining an optical path comprise a medium between said first and second polarizers for permitting rotation of the plane of polarization of the light beam under influence of the magnetic field when said device is oriented so that at least a portion of said optical path between said polarizers extends in a direction having a component parallel to the given direction so that the intensity of the light beam at said second optical port will vary as a function of variations in the intensity of the magnetic field.

2. A device as defined in claim 1 further comprising a first optical fiber connected to said first port for supplying a light beam to said first port, and a second optical fiber connected to said second port for receiving the light beam from said second port.

3. A device as defined in claim 1 wherein the radius of curvature of said concave surface is at least approximately equal to the length of the portion of said optical path between said focusing surface and one of said optical ports.

4. A device for monitoring a magnetic field intensity having a given direction comprising:
   light conducting means defining a first optical port, a second optical port, and an optical path extending between said ports for conducting a light beam between said ports;
   a first polarizer disposed in said optical path for polarizing the light beam in a first plane of polarization transverse to said path;
   a second polarizer disposed in said optical path for polarizing the light beam in a second plane of polarization transverse to said path, said second polarizer being spaced along aid path from said first polarizer; and
   means defining a focusing surface disposed to intersect the light beam at a point along said path between said polarizers to focus the light beam from said first optical port onto said second optical port,
wherein said means defining an optical path comprise a medium between said first and second polarizers for permitting rotation of the plane of polarization of the light beam under influence of the magnetic field when said device is oriented so that at least a portion of said optical path between said polarizers extends in a direction having a component parallel to the given direction so that the intensity of the light beam at said second optical port will vary as a function of variations in the intensity of the magnetic field, and said means defining an optical path further comprise first and second reflecting surfaces each disposed to change the direction of said optical path between a respective one of said ports and said focusing surface.

5. A device as defined in claim 4 wherein said first and second polarizers are each attached to a respective one of said first and second reflecting surfaces.

6. A device as defined in claim 4 wherein said optical path has a first linear segment between said first port and said first reflecting surface; a second linear segment between said first reflecting surface and said focusing surface, a third linear segment between said focusing surface and said second reflecting surface and a fourth linear segment between said second reflecting surface and said second port.

7. A device as defined in claim 6 wherein said first reflecting surface forms an angle of approximately 45° with said first segment and is perpendicular to the plane defined by said first and second segments, and said second reflecting surface forms an angle of approximately 45° to said fourth segment and is perpendicular to the plane defined by said third and fourth segments.

8. A device as defined in claim 6 wherein said focusing surface is a concave surface of spherical curvature having a center of curvature which lies on a line bisecting the angle formed by said second and third segments.

9. A device as defined in claim 8 wherein the radius of curvature of said concave surface is at least approximately equal to the sum of the length of said first and second segments.

10. A device as defined in claim 1 wherein said light conducting means comprise a body which is transparent to the light forming the beam and which is configured for confining light traveling between said ports within said body.

* * * * *